(12) United States Patent
Burt et al.

(10) Patent No.: US 8,026,768 B1
(45) Date of Patent: Sep. 27, 2011

(54) $^{201}$HG$^+$ CO-MAGNETOMETER FOR $^{199}$HG$^+$ TRAPPED ION SPACE ATOMIC CLOCKS

(75) Inventors: Eric A. Burt, La Canada Flintridge, CA (US); Shervin Taghavi, Pasadena, CA (US); Robert L. Tjoelker, La Crescenta, CA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 72 days.

(21) Appl. No.: 12/691,070

(22) Filed: Jan. 21, 2010

(51) Int. Cl.
  *H03L 7/26* (2006.01)
  *H03B 17/00* (2006.01)
  *H01S 3/091* (2006.01)
(52) U.S. Cl. ............... 331/3; 331/94.1; 372/70; 372/86
(58) Field of Classification Search ............ 331/3, 94.1; 372/69, 70, 72–75, 81, 86, 91; 356/437
See application file for complete search history.

(56) References Cited

U.S. PATENT DOCUMENTS

| | | | |
|---|---|---|---|
| 4,661,782 A | 4/1987 | Weidermann | |
| 5,379,000 A | 1/1995 | Brewer et al. | |
| 5,420,549 A | 5/1995 | Prestage | |
| 7,859,350 B1 * | 12/2010 | Schwindt et al. | 331/94.1 |

OTHER PUBLICATIONS

Berkeland et al., High-Accuracy Hg+ microwave and optical frequency standards in cryogenic linear ion traps, National Institute of Standards and Technology, Time and Frequency Division, 2002.*

U.S. Appl. No. 10/175,324, filed Nov. 28, 2002, Kitchling et al.
U.S. Appl. No. 12/201,848, filed Mar. 5, 2008, Prestage et al.
U.S. Appl. No. 12/116,431, filed Mar. 26, 2009, Jau et al.
U.S. Appl. No. 12/271,057, filed May 21, 2009, Nomura.
L. Maleki et al., Technical support package for magnetometer based on optoelectronic microwave oscillator, NASA Tech Briefs, 2004.
E. Burt et al., Magnetic compensation for second-order doppler shift in LITS I, NASA Tech Briefs, 2008.
R.L. Tjoelker, J.D. Prestage and L. Maleki: The JPL hg+ extended linear ion trap frequency standard: status, stability, and accuracy prospects, 28th Annual PTTI, Meeting, 1996.
R.L. Tjoelker, J.D. Prestage and L. Maleki: improved timekeeping using advanced trapped ion clocks, 31st Annual PTTI Meeting, 1999.

(Continued)

*Primary Examiner* — Levi Gannon
(74) *Attorney, Agent, or Firm* — Mark Homer

(57) ABSTRACT

Local magnetic field strength in a trapped ion atomic clock is measured in real time, with high accuracy and without degrading clock performance, and the measurement is used to compensate for ambient magnetic field perturbations. First and second isotopes of an element are co-located within the linear ion trap. The first isotope has a resonant microwave transition between two hyperfine energy states, and the second isotope has a resonant Zeeman transition. Optical sources emit ultraviolet light that optically pump both isotopes. A microwave radiation source simultaneously emits microwave fields resonant with the first isotope's clock transition and the second isotope's Zeeman transition, and an optical detector measures the fluorescence from optically pumping both isotopes. The second isotope's Zeeman transition provides the measure of magnetic field strength, and the measurement is used to compensate the first isotope's clock transition or to adjust the applied C-field to reduce the effects of ambient magnetic field perturbations.

15 Claims, 4 Drawing Sheets

OTHER PUBLICATIONS

J.D. Prestage, R.L. Tjoelker and L. Maleki: Higher pole linear traps for atomic clock applications, Frequency and Time Forum, 1999 & IEEE Interntl Freq Contr Symposium, 1999.

R.L. Tjoelker, et al., Mercury trapped-ion frequency standard for the global positioning system, 33rd Annual PTTI Meeting, CA, 2001.

S.A. Diddams et al. An optical clock based on a single trapped 199Hg+ ion, Science, vol. 293. No. 5531, pp. 825-828 Aug. 2001.

U. Tanaka et al., The 199Hg+ single ion optical clock: recent progress, J. Phys. B: At. Mol. Opt. Phys. 36, 545-551, 2003.

U. Tanaka et al., Optical frequency standards based on the 199Hg+ ion, IEEE Trans. Instrum. Meas. 52 (2), 245-249, 2003.

W.H. Oskay et al., Single-atom optical clock with high accuracy, Phys. Rev. Lett. 97, 020801, 2006.

L. Lorini et al., Recent atomic clock comparisons at NIST, Eur. Phys. J. Special Topics, 163, 19-35, 2008.

* cited by examiner

Figure 1. Simplified energy level diagram for $^{199}Hg^+$ (not to scale).

$^{201}$HG$^+$ CO-MAGNETOMETER FOR $^{199}$HG$^+$ TRAPPED ION SPACE ATOMIC CLOCKS

GOVERNMENT INTEREST

The invention described herein was made in the performance of work under a NASA contract and is subject to the provisions of Public Law 96-157 (35 U.S.C. §202) in which the Contractor has elected not to retain title.

BACKGROUND OF THE INVENTION

1. Field of the Invention

The present invention relates to atomic clocks and, particularly, to trapped mercury ion atomic clocks having a co-magnetometer.

2. Description of the Background

Atomic clocks are used in a variety of applications that require superior stability and reliability with continuous operations, including communications (frequency stabilization), navigation (GPS), astronomical observation (radio astronomy arrays), national timekeeping, and space navigation. The quality of a clock depends on its stability and accuracy. A stable clock is based on a constant, unchanging output frequency whose fluctuations are small, but whose absolute value may not be well known. An accurate clock is based on a frequency whose absolute value is well known.

In 1991, NASA demonstrated a new trapped mercury ion atomic clock that relies on an energy transition of trapped mercury ions (a mercury atom that is missing one electron). See J. D. Prestage, G. J. Dick, and L. Maleki, "Linear Ion Trap Based Atomic Frequency Standard," IEEE Trans. Instrum. and Meas. 40, pp. 132-136 (1991). Subsequently in 2002, NASA demonstrated an enhanced version of this clock that used two separated traps and shuttled ions between them. This trapped ion atomic clock is detailed in U.S. Pat. No. 5,420,549 to Prestage, which is incorporated by reference in its entirety. The '549 patent describes linear ion traps having either a single trap region or two trap regions. Generally, these linear ion traps are rf Paul traps that comprise multiple molybdenum rods to which an rf voltage is applied between rod pairs to create a trap well. The linear ion traps are generally used with mercury ions such as $^{199}$Hg$^+$.

FIG. 1 is a simplified energy level diagram for $^{199}$Hg$^+$. Using the linear ion trap in an atomic frequency standard, $^{199}$Hg$^+$ ions are created from a neutral mercury vapor by pulsing an electron beam along the trap axis and then collisionally cooling the trapped $^{199}$Hg$^+$ ions with a background buffer gas such as helium or neon. During state selection and detection, a $^{202}$Hg$^+$ discharge lamp generates ultraviolet light at 194 nm to optically pump the trapped $^{199}$Hg$^+$ ions into the $S_{1/2}$, F=0, $m_F$=0 ground state hyperfine level, by driving the $S_{1/2}$, F=1 to $P_{1/2}$, F=1 transition. The optically excited $^{199}$Hg$^+$ ions eventually decay back into the desired ground state hyperfine level, producing fluorescence. The discharge lamp is then dimmed to avoid an AC Stark shift, and an interrogating microwave field at approximately 40.507 GHz, derived from a local oscillator, drives the $S_{1/2}$, F=0, $m_F$=0 to $S_{1/2}$, F=1, $m_F$=0 clock transition. After interrogation, the lamp is again brightened and fluorescence given off by ions excited by this light is used for state detection. On each clock cycle, a small number of ions are lost from the trap so just after state detection, the electron beam is briefly pulsed on to replace these lost ions. The lamp is left in its bright state during this reloading phase to prepare the existing and new ions as before by optically pumping them back to the $S_{1/2}$, F=0, $m_F$=0 ground state hyperfine level. An optical detector, such as a photomultiplier tube, measures the fluorescence during state detection. The detected fluorescence indicates the degree to which ions were excited during microwave interrogation and therefore the degree to which the microwave interrogation frequency was on resonance with the clock transition. A coil is used to generate the quantization axis magnetic field (C-field).

The frequency of the interrogating microwave field is modulated from the clock transition frequency, 40.507 GHz, with an alternating offset frequency, $\pm\Delta\nu$, causing a corresponding modulation of fluorescence. The frequency of the oscillator is subsequently adjusted to null the difference in light fluorescence obtained at the $\pm\Delta\nu$ offsets. The condition of null fluorescence occurs when the multiplied output of the oscillator is centered on the atomic resonance, because frequency detuning to $\pm\Delta\nu$ will give equal fluorescence levels. The output signal of the oscillator provides a stable frequency reference to be used as the basis for an atomic clock.

The stability of the $^{199}$Hg$^+$ trapped ion atomic clocks, however, can be degraded by environmental perturbations such as thermal changes, magnetic fields, radiation, and acceleration. Accordingly, $^{199}$Hg$^+$ trapped ion atomic clocks are designed to be insensitive to these environmental perturbations, especially magnetic field variations. In terrestrial applications having minor variations in magnetic field, magnetic effects can be virtually eliminated in $^{199}$Hg$^+$ trapped ion atomic clocks by surrounding the clock with passive magnetic shields fabricated from a highly permeable nickel-iron alloy. In space, however, atomic clocks can be subject to much larger fluctuations in local magnetic fields that have the potential to greatly influence atomic transition frequencies and thus degrade clock stability, and passive magnetic shielding alone may be inadequate to prevent significant frequency fluctuations in the clock, or may exceed mass and volume restrictions that are critical for space navigation.

Accurate real time measurement of magnetic fields near or inside the ion trap would permit compensation for internal variations of the clock transition that would allow use of conventional shields or even reduction or elimination of the shielding. Using electronic magnetometers, such as a fluxgate magnetometer, does not solve this problem, however, because they generate their own perturbing electromagnetic fields, which prevents locating the magnetometer close enough to the trapped ions to determine the magnetic field experienced by the ions. Another potential solution is using the trapped $^{199}$Hg$^+$ ions themselves to measure the magnetic field environment by monitoring shifts on field sensitive, Zeeman transitions, but this method too degrades clock performance because such measurements must be made in place of some clock transition interrogations, thereby increasing the time required to average to a given stability level.

An atomic energy level is field sensitive (first order sensitivity) if the quantum number, $m_F$, is not equal to zero, $m_F \neq 0$. Conversely, an atomic energy level is field insensitive (second order sensitivity or less) if the magnetic quantum number is equal to zero. The change between magnetic quantum numbers, $\Delta m_F$, for a given transition determines the polarization required of the incident microwave field used to drive the transition. If $\Delta m_F$=0, for example, the $^{199}$Hg$^+$ clock transition from $S_{1/2}$, F=0, $m_F$=0 to $S_{1/2}$, F=1, $m_F$=0, the microwave polarization must be parallel to the quantization axis defined by the C-field, which here is parallel to the long axis of the trap, to drive the transition. If $\Delta m_F \neq 0$, the polarization must be perpendicular to the quantization axis. Essentially due to the different characteristics of trapped ion motion parallel and perpendicular to the quantization axis, transitions that are excited by microwaves with polarization parallel to the trap axis ($\Delta m_F$=0) are Doppler free, while transitions excited by microwaves with polarization perpendicular to the trap axis ($\Delta m_F \neq 0$) are Doppler broadened. The frequency of Doppler broadened transitions is less certain and this frequency uncertainty is highly temperature dependent. There are no field sensitive ($m_F \neq 0$), $\Delta m_F = 0$ hyperfine transitions for $^{199}Hg^+$ ions, and thus to probe a field sensitive transition without Doppler broadening, the ion trap and the microwave polarization must be rotated relative to the C-field. Additionally, interrogation of the field-sensitive transition must be sequential to the clock transition interrogation, which increases the clock cycle time and thus degrades clock performance.

Thus, there is a need for a method and apparatus for measuring the local magnetic field strength within an ion trap without degrading trapped ion atomic clock performance.

SUMMARY OF THE INVENTION

The present invention measures local magnetic field strength in real time by co-locating an isotope of an element with another isotope of the same element within the same linear ion trap. The second isotope has a field sensitive, Zeeman transition that resonates with the same microwave polarization as the first isotope's clock transition. For state selection, the atomic clock comprises a first discharge lamp that emits ultraviolet light that optically pumps the first isotope to a clock transition ground state, and a second discharge lamp that emits ultraviolet light that optically pumps the second isotope to a Zeeman transition ground state. A microwave radiation source emits a microwave field resonant with the first isotope's clock transition and the second isotope's Zeeman transition simultaneously, and an optical detector measures the subsequent fluorescence when the respective lamps are turned back on.

Use of a second isotope having a field-sensitive transition allows for simultaneous interrogation of the first isotope's clock transition and the second isotope's Zeeman transition. The interrogation of the second isotope's Zeeman transition allows complete characterization of its first-order sensitivity to magnetic field variations, which allows for an accurate measurement of the magnetic field that the clock ions experience as opposed to some other field value nearby. The calculated magnetic field strength is then used either to compensate the first isotope's clock transition interrogation analysis, or to adjust the strength of the C-field by closed-loop feedback from the second isotope error signal, in either case reducing or eliminating the effects of ambient magnetic field perturbations.

Furthermore, the interrogation of the second isotope's Zeeman transition is not Doppler broadened because the resonant microwave polarization of the second isotope's Zeeman transition is the same as the resonant microwave polarization of the first isotope's clock transition. This makes it possible to measure the field-sensitive Zeeman transition frequency with very high precision. In addition, because the Zeeman transition is measured in a different isotope from the clock transition, both transitions can be measured simultaneously, thereby avoiding significant degradation in clock performance.

For example, $^{201}Hg^+$ ions can be co-located within the same ion trap of a $^{199}Hg^+$ trapped ion atomic clock, wherein the $^{201}Hg^+$ ions are used as a magnetometer. The $^{201}Hg^+$ ions have field sensitive ground state hyperfine transitions with $\Delta m_F = 0$ (similar to the $^{199}Hg^+$ clock transition, but with $m_F \neq 0$): the $S_{1/2}$, $F=1$, $m_F=-1$ to $S_{1/2}$, $F=2$, $m_F=-1$ transition and the $S_{1/2}$, $F=1$, $m_F=1$ to $S_{1/2}$, $F=2$, $m_F=1$ transition. The volume of space occupied by the $^{201}Hg^+$ ions is virtually identical to that occupied by the clock $^{199}Hg^+$ ions so the field measured by the $^{201}Hg^+$ ions is precisely that experienced by the $^{199}Hg^+$ ions.

BRIEF DESCRIPTION OF THE DRAWINGS

Other objects, features, and advantages of the present invention will become more apparent from the following detailed description of the preferred embodiments and certain modifications thereof when taken together with the accompanying drawings in which.

DETAILED DESCRIPTION OF THE PREFERRED EMBODIMENT

The present invention measures local magnetic field strength in real time by co-locating an isotope of an element with another isotope of the same element within the same linear ion trap, for example, co-locating $^{201}Hg^+$ ions within the same ion trap of a $^{199}Hg^+$ trapped ion atomic clock. The $^{199}Hg^+$ ions are interrogated to establish clock transitions. The $^{201}Hg^+$ ions are used as a magnetometer by probing their field sensitive, Zeeman transition. The magnetic field strength is calculated and used either to compensate the first isotope's clock transition interrogation analysis, or to adjust the strength of the C-field by closing the loop on the C-field with the $^{201}Hg^+$ error signal, in either case reducing or eliminating the effects of ambient magnetic field perturbations. This approach reduces susceptibility to fluctuations in local magnetic fields which can otherwise influence atomic transition frequencies and degrade clock stability (especially in space), and reduces the need for magnetic shielding to insulate the atomic clock.

To maintain the same signal-to-noise ratio for both isotopes, the total number of trapped ions is preferably doubled either by increasing the trap's length or radius, or by increasing the trap's rf field amplitude relative to the parameters needed for trapping only the first isotope.

Figure 1:
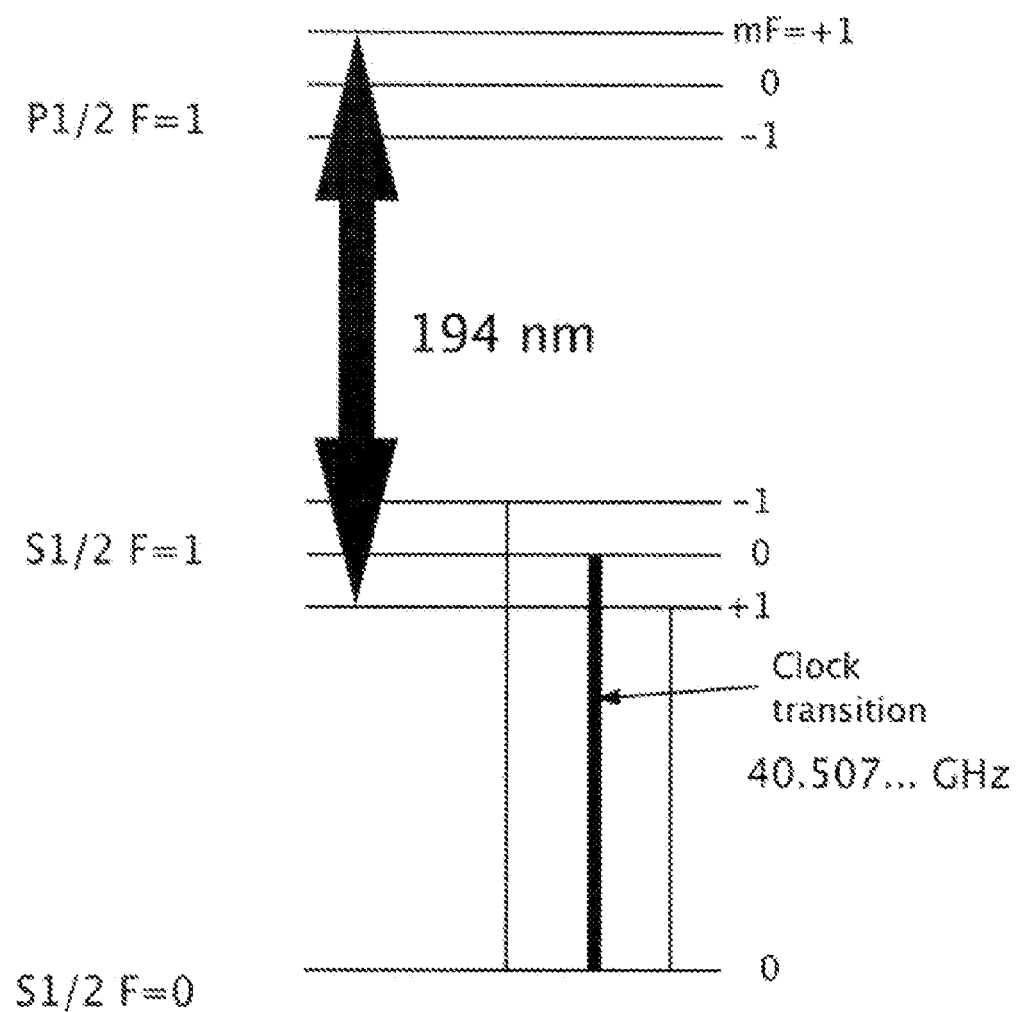
FIG. 1 is a simplified energy level diagram for $^{199}Hg^+$.
Figure 2:
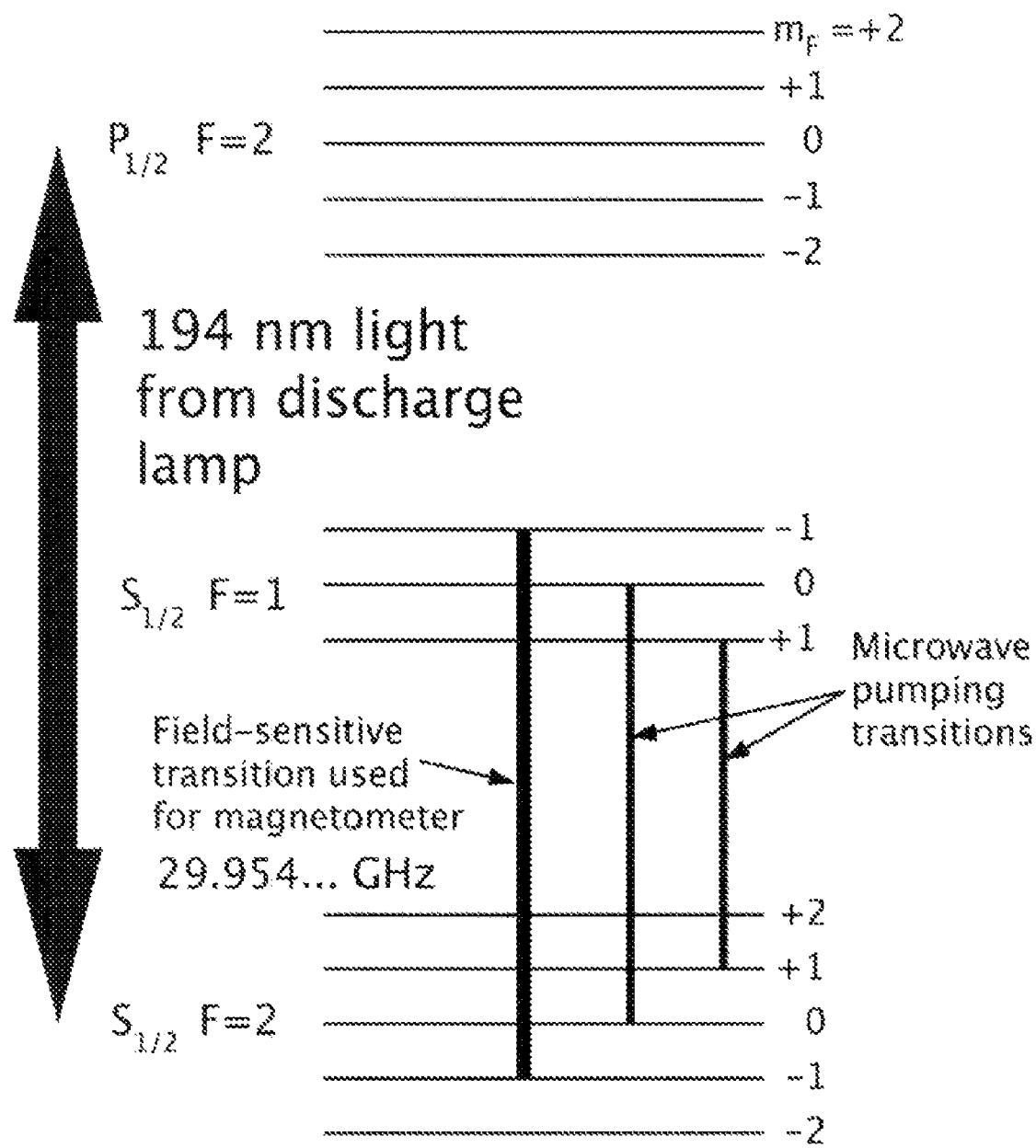
FIG. 2 is a simplified energy level diagram for $^{201}Hg^+$.

FIG. 2 is a simplified energy level diagram for $^{201}Hg^+$. In contrast to $^{199}Hg^+$, both $^{201}Hg^+$ hyperfine ground states have non-zero total angular momentum and multiple Zeeman levels. Thus, $^{201}Hg^+$ ions have field sensitive ground state hyperfine transitions with $\Delta m_F = 0$: the $S_{1/2}$, $F=1$, $m_F=-1$ to $S_{1/2}$, $F=2$, $m_F=-1$ transition and the $S_{1/2}$, $F=1$, $m_F=1$ to $S_{1/2}$, $F=2$, $m_F=1$ transition. The resonant microwave polarization of these transitions is the same as that used to excite the $^{199}Hg^+$ clock transition. These Zeeman transitions are first-order sensitive to magnetic field variations, which allows for an accurate measurement of the magnetic field with a resolution of approximately 10 nT to sub-1 nT. The resonant frequencies of these field sensitive, Zeeman transitions are known and are typically a few hundred kHz away from the $^{201}Hg^+$ clock transition, which is approximately 29.9544 GHz. The microwave polarization that drives these field sensitive ground state hyperfine transitions with $\Delta m_F = 0$ is parallel to the C-field, which itself is parallel to the long axis of the trap, and thus the spectroscopy is not Doppler broadened. Clock performance is not significantly degraded by this form of magnetic field measurement.

Figure 3:
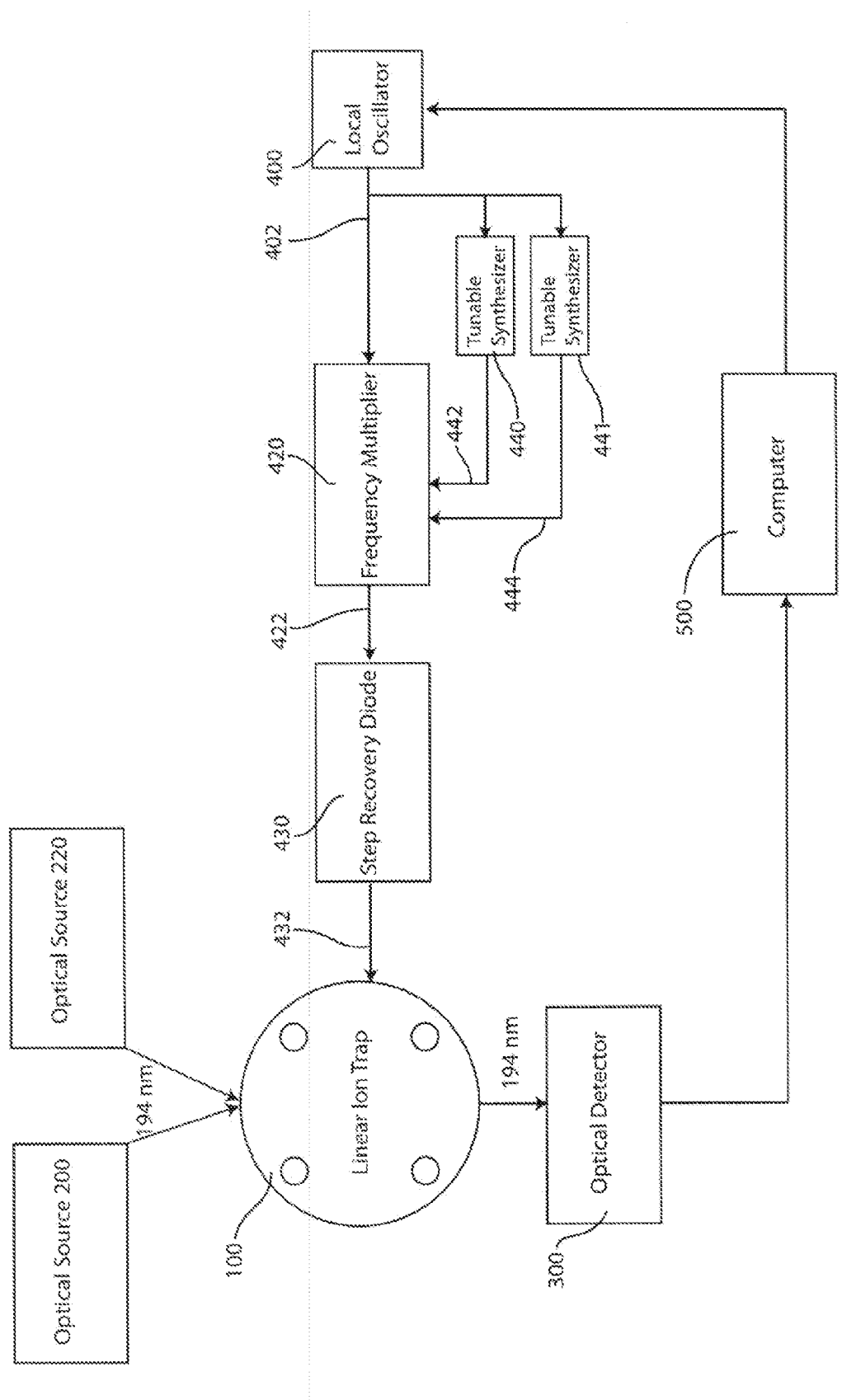
FIG. 3 is a simplified block diagram of the preferred physics package for co-locating $^{201}Hg^+$ ions within the same ion trap of a $^{199}Hg^+$ trapped ion atomic clock.

FIG. 3 is a simplified block diagram of the preferred system architecture for co-locating $^{201}Hg^+$ ions within the same ion trap 100 of a $^{199}Hg^+$ trapped ion atomic clock. The Optical Source 200 is a $^{202}Hg^+$ discharge lamp. In addition to first Optical Source 200, there is a second Optical Source 220, a mercury discharge lamp using $^{198}Hg^+$ for state selection and detection of the co-located $^{201}Hg^+$ ions. The $^{198}Hg^+$ discharge lamp 220 generates 194 nm ultraviolet light that optically pumps the $^{201}Hg^+$ ions to the Zeeman levels $m_F=-1, 0, +1$ of the F=1 ground state by driving the $S_{1/2}$, F=2 to $P_{1/2}$, F=2 transition. When the optically excited $^{201}Hg^+$ ions decay they produce fluorescence that is detected by an optical detector 300, such as a conventional photomultiplier tube. Optical detector 300 detects fluorescence of the $^{201}Hg^+$ and the $^{199}Hg^+$ and conveys the information to Computer 500 for state detection analysis.

Figure 4:
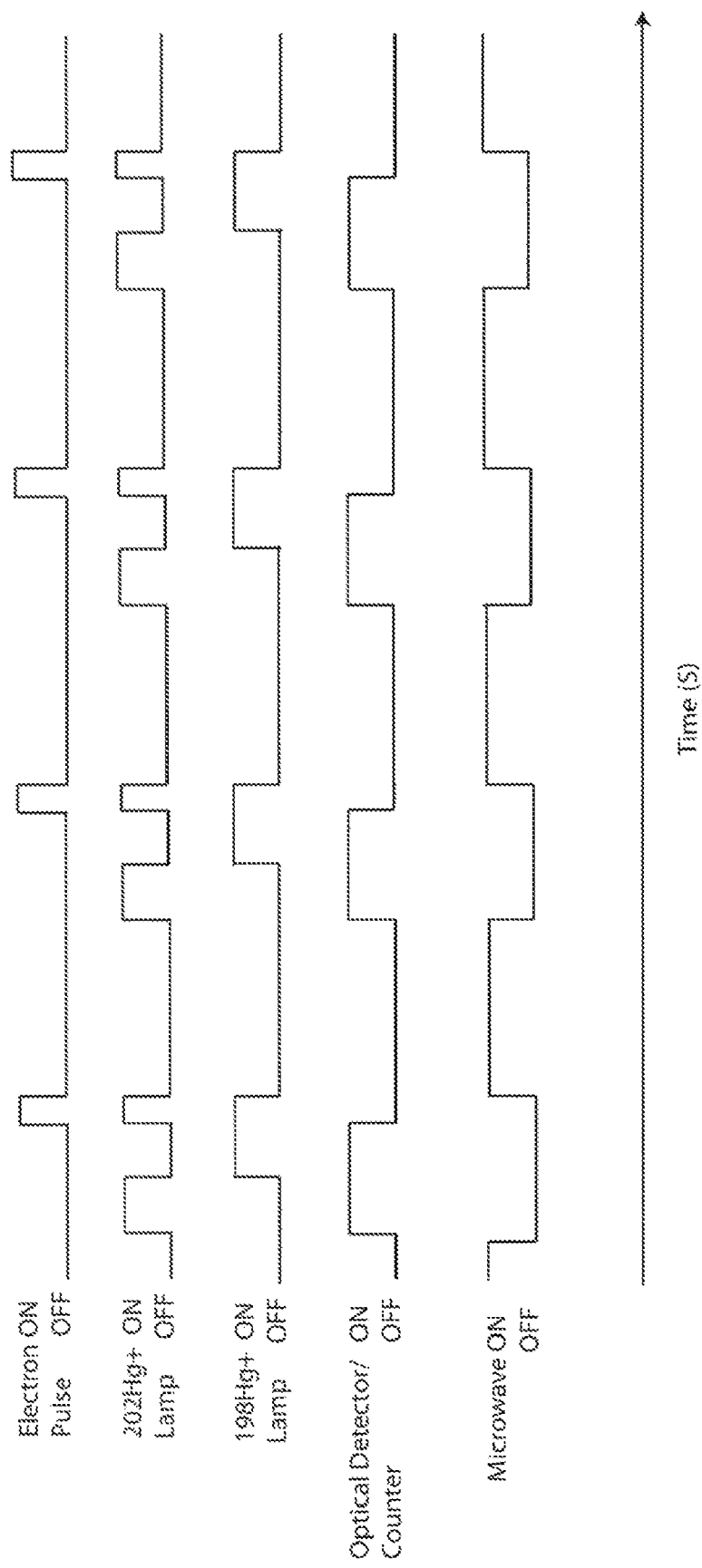
FIG. 4 is an exemplary timing diagram for the operation of the linear ion trap.

FIG. 4 is an exemplary timing diagram for the operation of the linear ion trap. The state detection of $^{201}Hg^+$ is performed sequentially with the state detection of $^{199}Hg^+$ because the optical detector 300 cannot distinguish between the fluorescence from the optically pumped $^{199}Hg^+$ ions and the fluorescence from the optically pumped $^{201}Hg^+$ ions. Preferably, state detection of the $^{199}Hg^+$ ions occurs first. This order ensures that any impurities in the $^{198}Hg^+$ discharge lamp 220 do not optically excite the $^{199}Hg^+$ ions, degrading clock performance. Once the state detection, which simultaneously results in state selection for existing ions, for both isotopes is complete, the electron beam is again pulsed on to load new ions. State selection is performed on the new ions by leaving optical source 220 on and turning source 200 back on briefly. The effect of sequential selection and detection on clock performance is minimized because the time necessary for state selection and detection is short compared to typical clock interrogation times. With $^{199}Hg^+$ ions, state detection and selection takes approximately 1.6 seconds, and with $^{201}Hg^+$ ions, state detection and selection takes approximately 0.5 seconds.

With the $^{201}Hg^+$ ions, the goal of state selection is to place the ions in the F=1, $m_F=-1(+1)$ state. Optical pumping from the $^{198}Hg^+$ discharge lamp will place the $^{201}Hg^+$ ions in the F=1 state, but this pumping does not distinguish between $m_F$ sub-levels—$^{201}Hg^+$ ions are left in the $m_F=0$ and $m_F=+1(-1)$ states that won't contribute to the overall signal. To improve signal-to-noise, a double resonance technique is employed that uses both optical and microwave frequencies. While the $^{198}Hg^+$ discharge lamp 220 is on, a carrier microwave frequency resonant with the F=2, $m_F=0$ to F=1, $m_F=0$ and a modulation sideband resonant with the F=2, $m_F=+1(-1)$ to F=1, $m_F=+1(-1)$ transition are emitted. The microwave and optical fields together cycle the $^{201}Hg^+$ ions until they decay into the desired F=1, $m_F=-1(+1)$ state.

The Computer 500 controls the sequential operation, and after state selection, the discharge lamps 200, 220 are dimmed, and the clock transition of $^{199}Hg^+$ is interrogated simultaneously with the field sensitive hyperfine transition of $^{201}Hg^+$ ions, either the $S_{1/2}$, F=1, $m_F=-1$ to $S_{1/2}$, F=2, $m_F=-1$ transition or the $S_{1/2}$, F=1, $m_F=1$ to $S_{1/2}$, F=2, $m_F=1$ transition, using a microwave field derived from a local oscillator (LO) 400. A frequency multiplier 420 multiplies the output signal 402 frequency and combines two offset signals 442 and 444. The offset signals 442 and 444 are derived from a pair of tunable synthesizers 440 and 441. Preferably, the combined signal 422 includes a signal with a sub-harmonic frequency of both the $^{199}Hg^+$ clock transition, approximately 40.5 GHz, and the $^{201}Hg^+$ Zeeman transition, approximately 30.0 GHz, such as 1.5 GHz, and includes the combined signals 442 and 444.

This combined signal 422 is then fed to a step recovery diode (SRD) 430, a conventional semiconductor junction diode having the ability to generate extremely short pulses. Using the frequencies of offset signals 442 and 444, the SRD 430 modulates the resulting harmonic frequency comb 432. Preferably, the offset frequencies 442, 444 are 7.347 MHz and 45.635 MHz to probe the $^{199}Hg^+$ clock transition and the $^{201}Hg^+$ Zeeman transition, respectively. For example, when SRD 430 is referenced to a 1.5 GHz frequency-multiplied signal 422 and 7.347 and 45.635 MHz offsets 442 and 444, SRD 430 produces a frequency comb 432 comprising 3.0 GHz±7.347 MHz, 3.0 GHz±45.635 MHz, 4.5 GHz±7.347 MHz, 4.5 GHz±45.635 MHz, ... 30.0 GHz±7.347 MHz, 30.0 GHz±45.635 MHz, . . . 40.5 GHz±7.347 MHz, 40.5 GHz±45.635 MHz, etc. The 30.0 GHz −45.635 MHz frequency interrogates the $^{201}Hg^+$ Zeeman transition, and the 40.5 GHz +7.347 MHz frequency interrogates the $^{199}Hg^+$ clock transition. The offset frequencies 442, 444 are produced by two high precision tunable synthesizers 440 and 441. These are conventional high precision frequency synthesizers for generating the desired offset frequencies (within a tunable range) from a fixed frequency oscillator. This approach allows simultaneous interrogation of the clock transition of $^{199}Hg^+$ from $S_{1/2}$, F=0, $m_F=0$ to $S_{1/2}$, F=1, $m_F=0$ at approximately 40.507 GHz and the magnetic field sensitive Zeeman transition of $^{201}Hg^+$ from $S_{1/2}$, F=1, $m_F=-1(+1)$ to $S_{1/2}$, F=2, $m_F=-1(+1)$ at approximately 29.954 GHz.

The fluorescence levels produced during the sequential state detection phases represent the microwave frequency offsets from the $^{199}Hg^+$ clock transition and $^{201}Hg^+$ Zeeman transition. In a closed loop atomic frequency standard, the LO 400, such as a 5 MHz quartz oscillator is locked to the resulting fluorescence measurement by use of a computer 500. Alternatively, in an open loop system using a very stable LO 400, such as a hydrogen maser, and with the precision tunable offset synthesizers referenced to the LO 400, the system can perform high-resolution spectroscopy of the clock transition and Zeeman transition.

Using the same modulation process as described above for the clock transition, a magnetically induced frequency shift can be detected after two cycles by differencing the successive optical fluorescence signals after the $^{201}Hg^+$ Zeeman transition has been excited. Using the detected field-sensitive frequency shift, the known zero-field frequency, and the known magnetic field sensitivity of the corresponding $^{201}Hg^+$ Zeeman transition, for example, $1.4 \times 10^{10}$ Hz/T for the F=1, $m_F=-1$ to F=2, $m_F=-1$ transition, the magnetic field can be determined by Computer 500. The calculated magnetic field strength can then be used together with the much smaller magnetic sensitivity of the $^{199}Hg^+$ clock transition, which is known, in the clock transition interrogation analysis or used to compile a $^{201}Hg^+$ error signal that is then used to adjust the strength of the C-field (e.g., by closing the loop on the C-field with the $^{201}Hg^+$ error signal). In both cases, either compensating the clock transition interrogation analysis or adjusting the C-field, the effects of ambient magnetic field perturbations are effectively reduced or eliminated without degrading clock performance.

Having now fully set forth the preferred embodiment and certain modifications of the concept underlying the present invention, various other embodiments as well as certain variations and modifications of the embodiments herein shown and described will obviously occur to those skilled in the art upon becoming familiar with said underlying concept. It is to be understood, therefore, that the invention may be practiced otherwise than as specifically set forth in the appended claims.

What is claimed:

1. An atomic clock, comprising:
    a linear ion trap that simultaneously traps a first isotope of an element having a resonant microwave transition between two hyperfine energy states, and a second isotope of the same element having a resonant Zeeman transition;
    a first optical source that emits ultraviolet light to optically pump the first isotope ions to a clock transition ground state;
    a second optical source that emits ultraviolet light that optically pumps the second isotope ions to a Zeeman transition ground state;
    a microwave radiation source that simultaneously emits microwave fields resonant with the first isotope's clock transition and the second isotope's Zeeman transition; and
    an optical detector for measuring the fluorescence from optically pumping the first isotopes and the second isotopes.

2. The atomic clock according to claim 1, wherein the microwave radiation source comprises a local oscillator that produces a first signal; two tunable precision synthesizers that produce a second signal and a third signal; a frequency multiplier that multiplies the first signal to a frequency that is a sub-harmonic of both the first isotope's clock transition and the second isotope's Zeeman transition and combines the second and third signals; and a step recovery diode referenced to the multiplied first signal and combined second and third signals to produce a frequency comb at multiples of the sub-harmonic with frequency offsets that correspond to the frequency of the second and third signals.

3. The atomic clock according to claim 2, wherein the first isotope is $^{199}$Hg$^+$ and the second isotope is $^{201}$Hg$^+$.

4. The atomic clock according to claim 3, wherein the first optical source is a first mercury discharge lamp using $^{202}$Hg$^+$ ions and the second optical source is a second mercury discharge lamp using $^{198}$Hg$^+$ ions.

5. The atomic clock according to claim 4, wherein the first signal has a frequency of 1.5 GHz; the second signal has a frequency of 7.35 MHz; and the third signal has a frequency of 45.64 MHz.

6. The atomic clock according to claim 5, wherein the microwave radiation source also emits microwaves resonant with the F=2, $m_F$=0 to F=1, $m_F$=0 transition and with the F=2, $m_F$=+1 to F=1, $m_F$=+1 transition when the second discharge lamp is optically pumping the $^{201}$Hg$^+$ isotope to improve the signal-to-noise ratio.

7. A method for measuring the magnetic field experienced by an atomic clock without significant degradation of clock performance, comprising the steps of:
    providing an atomic clock comprising,
        a linear ion trap that simultaneously traps a first isotope of an element having a resonant microwave transition between two hyperfine energy states, and a second isotope of the same element having a resonant Zeeman transition,
        a first optical source that emits ultraviolet light to optically pump the first isotope ions to a clock transition ground state,
        a second optical source that emits ultraviolet light that optically pumps the second isotope ions to a Zeeman transition ground state,
        a microwave radiation source that simultaneously emits microwave fields resonant with the first isotope's clock transition and the second isotope's Zeeman transition, and
        an optical detector for measuring the fluorescence from optically pumping the first isotopes and the second isotopes;
    emitting ultraviolet light from the first optical source to optically pump the first isotope to the clock transition ground state;
    emitting ultraviolet light from the second optical source to optically pump the second isotope to the Zeeman transition ground state;
    simultaneously emitting microwave fields resonant with the first isotope's clock transition and the second isotope's Zeeman transition to interrogate the clock transition and the Zeeman transition;
    measuring the fluorescence from the optically pumped first and second isotopes using an optical detector; and
    determining the magnetic field using the fluorescence measurements.

8. The method according to claim 7, wherein the microwave radiation source comprises:
    a local oscillator that produces a first signal;
    two tunable precision synthesizers that produce a second signal and a third signal;
    a frequency multiplier that multiplies the first signal to a frequency that is a sub-harmonic of both the first isotope's clock transition and the second isotope's Zeeman transition and combines the second and third signals; and
    a step recovery diode referenced to the multiplied first signal and combined second and third signals to produce a frequency comb at multiples of the sub-harmonic with frequency offsets that correspond to the frequency of the second and third signals.

9. The method according to claim 8, wherein the first isotope is $^{199}$Hg$^+$ and the second isotope is $^{201}$Hg$^+$.

10. The method according to claim 9, wherein the first optical source is a first mercury discharge lamp using $^{202}$Hg$^+$ ions and the second optical source is a second mercury discharge lamp using $^{198}$Hg$^+$ ions.

11. The method according to claim 10, wherein the steps of emitting ultraviolet light from the first mercury discharge lamp using $^{202}$Hg$^+$ ions and emitting ultraviolet light from the second mercury discharge lamp using $^{198}$Hg$^+$ ions occurs sequentially.

12. The method according to claim 11, wherein the first signal has a frequency of 1.5 GHz; the second signal has a frequency of 7.35 MHz; and the third signal has a frequency of 45.64 MHz.

13. The method according to claim 11, further comprising the step of emitting microwave fields resonant with the F=2, $m_F$=0 to F=1, $m_F$=0 transition and with the F=2, $m_F$=+1 to F=1, $m_F$=+1 transition when the second mercury discharge lamp is optically pumping the $^{201}$Hg$^+$ isotope to improve the signal-to-noise ratio.

14. The method according to claim 7, further comprising the step of adjusting the strength of the atomic clock's C-field based on the measured magnetic field to compensate for the effects of ambient magnetic field perturbations.

15. The method according to claim 7, further comprising the step of adjusting the first isotope's clock transition interrogation analysis to compensate for the effects of ambient magnetic field perturbations.

* * * * *